William J. Moroney
Henri R. Chalifour
Inventors
by Alfred H. Rosen
Attorney

William J. Moroney
Henri R. Chalifour
Inventors
by Alfred H. Rosen
Attorney

United States Patent Office 3,457,471

Patented July 22, 1969

3,457,471

SEMICONDUCTOR DIODES OF THE JUNCTION TYPE HAVING A HEAT SINK AT THE SURFACE NEARER TO THE JUNCTION

William J. Moroney, Wenham, and Henri R. Chalifour, Methuen, Mass., assignors to Microwave Associates, Inc., Burlington, Mass., a corporation of Massachusetts Filed Oct. 10, 1966, Ser. No. 585,515
Int. Cl. H01l 5/00, 11/06
U.S. Cl. 317—234 12 Claims

ABSTRACT OF THE DISCLOSURE

A junction-type semiconductor diode is shown having a heat sink at the surface nearer to the junction to facilitate heat transfer. The diode is mounted in a rigid housing package of which the heat sink is a part and supports the diode in the housing. A resilient connection is made between the package and another surface of the diode.

One of the principal factors limiting the utility of semiconductor devices is the thermal resistance which in turn measures the power dissipation capability of a particular device. Particularly when it is desired to use a semiconductor device as an oscillator in a CW mode, the power dissipation capability is a limiting factor on the obtainable CW output. For example, semiconductor diodes as currently available, when operated as oscillators in the avalanche mode exhibit a high $V \times I$ product, and present a desperate thermal transfer situation to the device designer.

According to the present invention, the thermal resistance of a semiconductor device is significantly reduced in a structure comprising a body of electronic semiconductor material having at least two zones of differing electrical properties in which a junction between two such zones is located generally parallel to and relatively much closer to a first surface portion of the body than to other surface portions thereof, substantially rigid electrically conductive means providing a thermal sink ohmically bonded to the body at the first surface portion, and resilient electrical conductor means ohmically connected to the body at another surface portion thereof.

In one general example of embodiments of the invention, the semiconductor body is in the form of a flat chip having a mesa thereon and the junction is in the mesa substantially parallel to the outer surface thereof, the thermal sink is ohmically bonded to the outer surface and the resilient conductor is connected to the surface of the chip opposite the mesa surface.

In another general example of embodiments of the invention, the semiconductor body is in the form of a flat chip having the junction beneath a portion of one flat surface and turned up at its periphery to intersect that surface, the portion of that surface bounded by the line of such intersection constituting the first surface portion, the thermal sink is in the form of a flat rigid metal body having a protuberant portion on one side thereof with a flat table surface only slightly smaller than said first surface portion and ohmically bonded at the table surface to said first surface portion within and out of contact with said line of intersection.

The structure may in any case be designed to provide the desirable electrical properties, such as capacitance in a given circuit, which are available from prior semiconductor devices, so that the reduction in thermal resistance which is made possible by the invention can be used without sacrifice of other desirable electrical properties.

The thermal resistance of a semiconductor device must be considered for the semiconductor body in combination with its package and the electrical connecting structure between the body and the package. Several improvements and innovations have been developed in semiconductor device packaging, especially for devices intended for use as generators of or oscillators at microwave frequencies, and many of these are available for use where the need to reduce the package thermal resistance is an important consideration. Among these is the microwave diode assembly which is described and claimed in the application of Larry L. Mesler, Ser. No. 491,308 filed Sept. 29, 1965, and assigned to the same assignee as the present application. According to the prior art as is exemplified in the structure of that assembly, a junction-type semiconductor diode is intimately bonded ohmically at one electrode to a relatively massive electrically conductive heat sink and is ohmically connected at the other electrode to a resilient electrical conductor. This general type of prior art structure is illustrated in FIG. 1 of the accompanying drawings, from which it will be observed that the semiconductor junction or active zone junctions, at which power (and therefore heat) is generated is or are located nearer to the surface which is connected to the resilient electrode than to the surface which is bonded to the heat sink. Since junction-type diodes can be constructed so that the bulk resistivity of the semiconductor body is considerably lower than the bulk resistivity of the junction region (e.g.: as little as $1/10$ that of an epitaxially-grown layer, for example), it has been the practice to locate the relatively massive heat sink in contact with the body portion having the lower bulk resistivity. At the same time, the junction regions, whether in mesa-type devices, or in so-called "planar" type structures, have been kept relatively small and located near a second surface remote from the heat sink, giving control of electrical resistance, capacitance and inductance parameters. By connecting a resilient electrical conductor between this second surface and the second electrode of the package desirable mechanical and thermal properties, as well as electrical properties, can be achieved. However, the thermal resistance of even the best of such assemblies is too high to permit optimum CW operation of a semiconductor diode oscillator in the avalanche mode.

For diode oscillators operating CW in the avalanche mode, one needs at least a certain minimum current density at avalanche voltage. This means that the device must be able to sustain a high power density in order to operate in a CW mode, and further that the efficiency improves sharply as the device is made capable of withstanding still higher power density. CW operation at the maximum capability of available silicon devices, for example, is practically impossible with the conventional mounting techniques of the prior art. While operation at the 1–10 milliwatt range is possible with prior art structures, the present invention makes possible operation at 200 milliwatts, at substantially improved efficiency.

It is thus a principal object of the invention to reduce the thermal resistance of semiconductor device assemblies.

It is a more particular object of the invention to reduce the thermal resistance of silicon diodes operating in the avalanche mode as CW oscillators at microwave frequencies. Another object is to provide a novel structure in semiconductor assemblies. A further object is to provide such a novel structure which reduces thermal resistance while substantially retaining electrical and mechanical properties available from prior art semiconductor assemblies. This reduction in thermal resistance permits the operation of varactor diodes, for example, at lower junction temperatures, for improved reliability.

These and other objects and features of the invention will be apparent from the following description of certain embodiments of it. This description refers to the accompanying drawings, in which.

Figure 1:
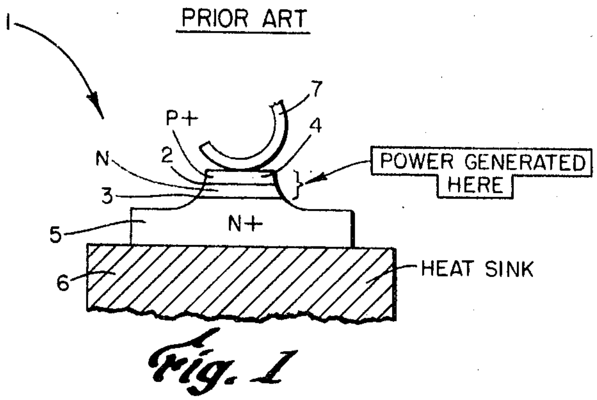
FIG. 1 illustrates a prior art structure.

FIG. 1 shows a prior art structure, in which a semiconductor body 1 of the mesa-type has two junctions 2 and 3 in the mesa portion 4 and is connected (e.g.: bonded) at its base portion 5 to a heat sink 6. As shown, the semiconductor may be made of silicon P+, N, N+ with the first junction 2 in the mesa between the P+ and N types, and the second junction 3 in the mesa between the N and N+ types. The N+ silicon is in the base portion 5. A resilient electrode 7 is connected (not necessarily bonded) to the outer surface of the mesa 4, at the P+ type material. During operation power is generated at the junctions 2, 3, and the resultant heat is expected to flow through the base portion 5 to the heat sink 6. When the heat generated at the junctions exceeds the ability of the structure to dissipate heat, device burnout usually results. Steps heretofore taken to improve the ability to dissipate heat, including attaching the sink 6 to a finned radiator, or immersing it in liquid nitrogen, have been effective to a limited degree. It is also known to choose the material of the base region for relatively low bulk resistivity, and the beneficial effects of this choice have been pushed to their limit. The main deterrent to increased output power remains the thermal resistance from the junction or junctions to the package, that is, essentially to the heat sink. While FIG. 1 shows a structure having two junctions, it will be understood that the same discussion applies to a structure having only one junction, or a structure having more than two junctions.

Figure 4:
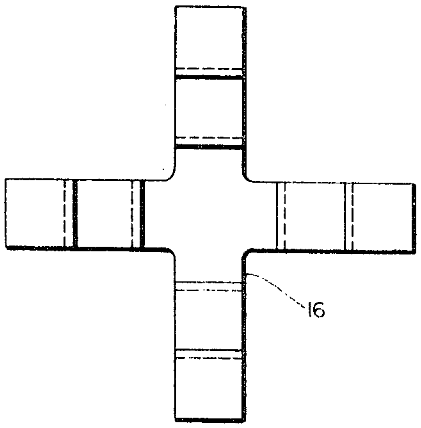
FIGS. 3 and 4 are views of the resilient electrode member in FIG. 2.
Figure 2:
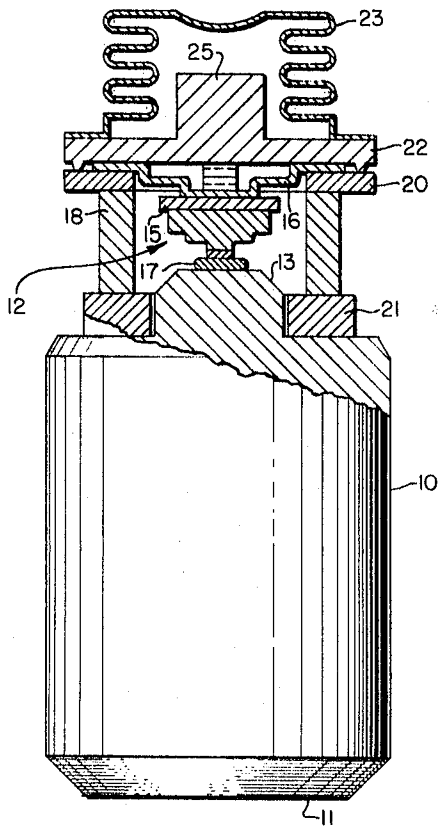
FIG. 2 shows an elevation, partly in section, of a complete semiconductor diode package assembly accordingly to the invention.
Figure 3:
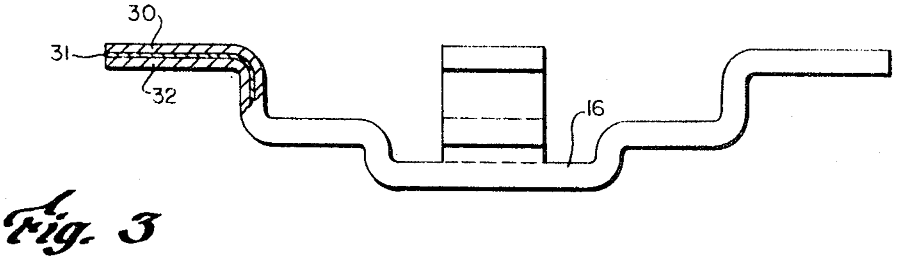

FIGS. 2, 3 and 4 show a new diode configuration 12 according to the invention, embodied in a package of the kind which is described and claimed in the aforementioned application of Mesler. A heat sink and mounting base 10 is made of a suitable highly conductive metal such as a copper alloy. Base 10 is the electrical connection point for one of the electrodes of the diode. The base 10 may be externally threaded for ease of making an electrical and mechanical connection to a support (not shown). A semiconductor diode element 12 is mounted according to the present invention on a raised portion 13 of base 10 upon a gold preform 17, as is shown in enlarged detail in FIG. 6.

The second electrode of the diode element 12 is made by contacting the base portion with a contact strip 16. Between the contact strip 16 and the semiconductor body is (optionally) a molybdenum platform 15. The semiconductor element 12 is further surrounded by a hollow dielectric cylinder 18 supported between contact strip 16 and base 10 by top and bottom washers 20 and 21 of low expansion coefficient metal. The dielectric cylinder is preferably made of a very high resistivity ceramic such as beryllium-oxide ceramic or aluminum oxide ceramic. Various glasses are also suitable. Suitable metals for washers 20 and 21 are nickel-iron alloys.

One such alloy consists of 20% nickel, 17% cobalt, 0.2% manganese and the balance iron manufactured by Westinghouse Electric Corporation under the trademark "Kovar." Another such alloy consists of 36% nickel and the balance iron available from Driver-Harris Co. under the trademark "Nilvar." Contact strip 16 is covered by a cap plate 22, which is welded to the top washer 20, which in turn serves for this purpose as a weld flange. A bellows contact 23 is connected to the cap plate 22 to serve as an elastic electrical contact. A raised portion 25 in the center of cap plate 22 acts as a stop for bellows contact 23 to prevent collapsing of the bellows beyond its elasticity limits. In the configuration illustarted, the bellows contact 23 is used as the external connection point for one electrode of the diode element 12. Bellows contact 23 has been made of nickel. However, the material is not critical as long as it has elasticity and a conductive path is provided for electrical contact.

Contact strip 16 is a laminated assembly shown in detail in FIGS. 3–4. The strip is made primarily of copper 30 about .002" thick. Three-quarter hard OFHC copper has been found suitable. The copper is clad on one side with a gold layer 31 which in turn is clad with a tin layer 32.

Strip 16 may be shaped in the form of a cross as illustrated in FIG. 4. Each leg of the contact strip 16 is stamped out with a plurality of right angle bends as is shown in FIG. 3 to reduce the effects of thermal expansion. Thus, any expansion or construction due to temperature is absorbed by the right angle bends reducing nonuniformity in the operation of the diode under changing temperature conditions.

The means of bonding one part to another in the package shown in FIG. 2 may include soldering and welding. Soldering is intended to include brazing when the higher temperature will not injure the components. In some instances soldering can be used where welding is specified. Strictly mechanical bonding means can also be used, these details forming no part of the present invention.

Figure 6:
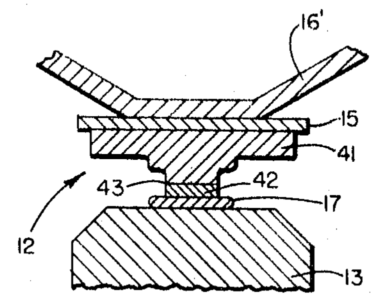
FIG. 6 is a similar elevation of the diode member according to the invention which is shown in FIG. 2.

FIG. 6 illustrates the diode element 2 in greater detail. The silicon body, or "die," has a base portion 41 and a mesa portion 42 containing a single p–n junction 43. A portion 16' of the resilient contact strip 16 is desirably brazed to the platform 15 at the "bottom" surface of the base portion 41 of the silicon die. The opposite surface of the mesa portion 42 is affixed to the pedestal 13 through the gold preform 17, which facilitates achieving good ohmic contact between the mesa portion and the pedestal. Silicon having a bulk resistivity approximately 0.09 ohm cm. is suitable. The mesa portion 42 may be about 3 mils (mil-inches) in diameter, the p–n junction 43 may be 0.8 mil deep (i.e.: from the mesa surface) and the gold preform 17 may be 1 mil thick. This semiconductor structure may be a known configuration having a low resistivity body and a thin junction of higher resistivity material, in which heat is generated, during opeartion, at the reigon of the junction 43. Despite the higher resistivity of the thin layer of material between the junction and the heat sink, we have found that semiconductor diodes constructed substantially as shown in FIG. 6, and incorporated in a package of the kind shown in FIG. 2, have substantially improved power dissipating ability.

Figure 5:
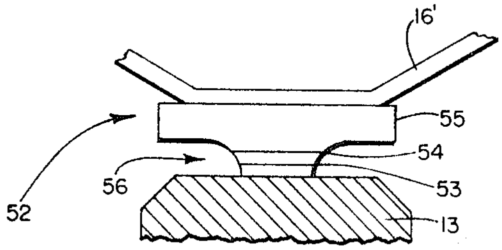
FIG. 5 is an enlarged side elevation partly in section of a semiconductor diode member suitable for use in FIG. 2.

FIG. 5 shows some variations that are possible. The die 52 has two junctions 53, 54 in the mesa 56. The resilient contact strip is affixed directly at portion 16' to the "bottom" surface of the base portion 55 of the die. While the contact strip may be bonded, as by brazing, to the die, it need only be in good electrical contact. The mesa portion 56 is soldered directly to the pedestal 13; while this is a useful mode of construction, the use of the gold "ball" or preform 17 (shown in FIG. 6) makes for easier mounting of the die to the pedestal.

We have found that in diodes according to the invention the thermal resistance "$\theta$," defined as $$\theta = \frac{(\text{junction temperature}) - (\text{heat sink temperature})}{(\text{power dissipated})}$$

(expressed in degrees C./watt) has been decreased by a factor of two (2) or more for CW diode oscillators operated in an avalanche mode. For example, the $\theta$ for a diode according to FIG. 5 in a package essentially according to FIG. 2, with an 8 mil mesa diameter and a 1 mil mesa height, would be approximately 4° C./watt. Similar diode structures mounted according to the prior art, as shown in FIG. 1, have $\theta$'s of approximately 10° C./watt. For the smaller junction diameter (3.0 mils) illustrated in FIG. 6, the $\theta$ can be 20° C./watt, for CW diode oscillation in an avalanche mode, as compared to 40° C./watt and higher for prior art devices.

Figure 7:
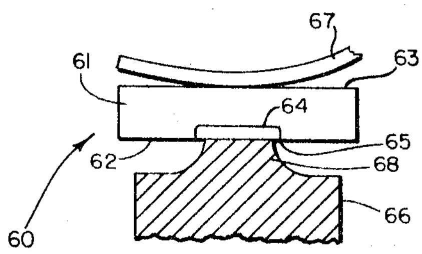
FIG. 7 is a side elevation, partly in section, of still another diode member according to the invention.

The invention is not limited to any particular diode die construction. FIG. 7 shows a diode die 60 having a main body portion 61 bounded by two essentially parallel surfaces 62 and 63, in which there is a semiconductor junction 64 near to and parallel to the first surface 62, the junction turning toward the first surface so that its boundary 65 lies in the first surface. This will be recognized as an example of the structure that can be made according to the Derick and Frosch Patent No. 2,802,760. A heat sink 66, having a pedestal 68 of diameter a little smaller than the diameter of the junction boundary 65, is suitably bonded at the table surface of the pedestal to the first surface 62 within the boundary 65. A resilient electrical conductor 67 makes electrical contact with the second surface 63 of the die 60; this conductor may be soldered or brazed to the die, if desired.

The general construction of the invention improves the thermal properties of semiconductor devices without noticeably altering the electrical properties heretofore available. It is useful with all known kinds of junction-type semiconductor devices, including without limitation heterojunction types, and devices in which junctions are formed by diffusion or by epitaxial deposition. Known techniques for fabrication of semiconductor devices can be used as desired. The provision of a heat sink directly at the higher resistivity material associated with the junction at which heat is developed during operation is done in a manner that does not noticeably alter the capacitance or inductance of the device. The advantages of one resilient contact in an otherwise rigid package are also preserved.

The foregoing description of certain embodiments of the invention is by way of example only, and not intended to limit the scope of the appended claims. No attempt has been made to illustrate all possible embodiments of the invention, but rather only to illustrate its principles and the best manner presently known to practice it. Therefore, such other forms of the invention as may occur to one skilled in this art on a reading of the foregoing specification are also within the spirit and scope of the invention, and it is intended that this invention includes all modifications and equivalents which fall within the scope of the appended claims.

We claim:

1. Semiconductor device comprising a body of electronic semiconductor material having at least two zones of differing electrical properties in which a junction between two such zones is located generally parallel to and relatively much closer to a first surface portion of said body than to other surface portions thereof, said device being characterized in that power is generated in the vicinity of said junction during operation of the device, substantially rigid electrically conductive means providing a thermal sink ohmically bonded to said body at said first surface portion, and resilient electrical conductor means ohmically connected to said body at another surface portion thereof, a substantially rigid hollow package for said device, said thermal sink being a fixed part of and supporting said device within said package, said resilient conductor means being connected to another part of said package.

2. Semiconductor device according to claim 1, in which said body is in the form of a flat die having a mesa thereon and said junction is in the mesa substantially parallel to the outer surface thereof, said thermal sink is bonded to said outer surface and said resilient conductor is conductor is connected to the surface of said die opposite said outer surface.

3. Semiconductor device according to claim 1 in which said body is in the form of a flat die having first and second parallel surfaces with said junction beneath a portion of said first surface and turned up at its periphery to intersect said first surface, the portion of said first surface bounded by the line of such intersection constituting said first surface portion, said thermal sink being in the form of a flat rigid metal body having a protuberant portion on one side thereof with a flat table surface only slightly smaller than said first surface portion and bonded at said table surface to said first surface portion within and out of contact with said line of intersection, and said resilient conductor is connected to said body at said second surface.

4. Semiconductor device according to claim 1 in which said junction is an abrupt, epitaxially formed, junction and said thermal sink is bonded to the epitaxially-deposited layer of semiconductor material.

5. Semiconductor device according to claim 1 in which said thermal sink is bonded to said first surface through a layer of gold.

6. Semiconductor device according to claim 1 in which said resilient electrical conductor is a flexible strap a portion of which is ohmically bonded to said body.

7. Semiconductor device according to claim 1 in which said body of semiconductor material is a flat die having substantially parallel top and bottom surfaces with dimensions larger than their separation, and said junction is substantially parallel to said top and bottom surfaces and closer to one than the other of them, and said first surface portion is a part of said one surface smaller in area than the area contained within the boundaries of said one surface.

8. Semiconductor device according to claim 1 in which said thermal sink has a protuberant portion which is ohmically bonded to said semiconductor body, and a shoulder surrounding said protuberant portion, an insulating sleeve mounted at one end on said shoulder surrounding and spaced from said protuberant portion and said body, and said resilient conductor means is supported from the other end of said sleeve.

9. Semiconductor device according to claim 7 in which said resilient conductor means is a flexible elongated strap having at least one end portion connected to said sleeve and a portion which is ohmically bonded to said semiconductor body.

10. Semiconductor device according to claim 2 having at least two junctions spaced apart in said mesa.

11. Semiconductor device according to claim 2 in which a body of gold is interposed between said thermal sink and said outer surface for bonding said thermal sink to said semiconductor body.

12. Semiconductor device according to claim 1 in which the bulk resistivity of the zone adjacent said heat sink is higher than the bulk resistivity of the zone adjacent said resilient conductor.

References Cited

UNITED STATES PATENTS

| | | | |
|---|---|---|---|
| 2,854,610 | 9/1958 | Waters et al. | 317—234 |
| 2,956,214 | 10/1960 | Herbst | 317—234 |
| 3,025,439 | 3/1962 | Anderson | 317—235 |
| 3,201,664 | 8/1965 | Adam | 317—235 |
| 3,283,218 | 11/1966 | Goldman et al. | 317—235 |
| 3,300,841 | 1/1967 | Fisher et al. | 317—235 |
| 3,319,135 | 5/1967 | Cunningham | 317—235 |
| 3,375,417 | 3/1968 | Hull et al. | 317—235 |

JAMES W. LAWRENCE, Primary Examiner

A. J. JAMES, Assistant Examiner

U.S. Cl. X.R.

317—235

PO-1050
(5/69)

UNITED STATES PATENT OFFICE
CERTIFICATE OF CORRECTION

Patent No. 3,457,471 Dated July 22, 1969

Inventor(s) William J. Moroney and Henri R. Chalifour

It is certified that error appears in the above-identified patent and that said Letters Patent are hereby corrected as shown below:

Col. 4, line 20, "construction" should be --contraction--;
Col. 4, line 31, "2" should be --12--; and
Col. 5, line 72, delete "conductor is" (first occurrence).

SIGNED AND
SEALED
FEB 24 1970

(SEAL)
Attest:

Edward M. Fletcher, Jr.
Attesting Officer

WILLIAM E. SCHUYLER, JR.
Commissioner of Patents